United States Patent
Yang et al.

(10) Patent No.: US 7,244,640 B2
(45) Date of Patent: Jul. 17, 2007

(54) METHOD FOR FABRICATING A BODY CONTACT IN A FINFET STRUCTURE AND A DEVICE INCLUDING THE SAME

(75) Inventors: Kuo-Nan Yang, Hsin-Chu (TW); Yi-Lang Chen, Miao-Li (TW); Hou-Yu Chen, Kaohsiung (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 103 days.

(21) Appl. No.: 10/968,229

(22) Filed: Oct. 19, 2004

(65) Prior Publication Data

US 2006/0084211 A1 Apr. 20, 2006

(51) Int. Cl.
*H01L 21/00* (2006.01)
(52) U.S. Cl. ................ 438/157; 438/283; 257/E21.442
(58) Field of Classification Search ................ 438/157, 438/283; 257/E21.442
See application file for complete search history.

(56) References Cited

U.S. PATENT DOCUMENTS

| 4,996,574 | A | 2/1991 | Shirasaki |
|---|---|---|---|
| 5,565,368 | A | 10/1996 | Tsuji |
| 5,574,294 | A | 11/1996 | Shepard |
| 5,646,058 | A | 7/1997 | Taur et al. |
| 6,049,110 | A | 4/2000 | Koh |
| 6,165,828 | A | 12/2000 | Forbes et al. |
| 6,252,284 | B1 | 6/2001 | Muller et al. |
| 6,387,739 | B1* | 5/2002 | Smith, III ............ 438/157 |
| 6,953,738 | B2* | 10/2005 | Veeraraghavan et al. ... 438/479 |

OTHER PUBLICATIONS

Edward J. Nowak et al., "Turning Silicon On Its Edge", Overcoming Silicon Scaling Barriers With Double-Gate and FinFET Technology, Jan./Feb. 2004, pp. 20-30, IEEE Circuits & Devices Magazine, 8755-3996/04.

* cited by examiner

*Primary Examiner*—Chandra Chaudhari
(74) *Attorney, Agent, or Firm*—Haynes and Boone, LLP

(57) ABSTRACT

A method for fabricating a Finfet device with body contacts and a device fabricated using the method are provided. In one example, a silicon-on-insulator substrate is provided. A T-shaped active region is defined in the silicon layer of the silicon-on-insulator substrate. A source region and a drain region form two ends of a cross bar of the T-shaped active region and a body contact region forms a leg of the T-shaped active region. A gate oxide layer is grown on the active region. A polysilicon layer is deposited overlying the gate oxide layer and patterned to form a gate, where an end of the gate partially overlies the body contact region to complete formation of a Finfet device with body contact.

11 Claims, 6 Drawing Sheets

METHOD FOR FABRICATING A BODY CONTACT IN A FINFET STRUCTURE AND A DEVICE INCLUDING THE SAME

FIELD OF THE INVENTION

The present disclosure relates to a method of fabricating a Finfet device, and more particularly, to a method of forming a Finfet device having a body contact in the fabrication of an integrated circuit device and a device including such a body contact.

BACKGROUND

FIG. 1 illustrates an example of a Finfet device 10; that is, a field effect transistor (FET) having fins. In the figure are shown a gate 12, source 14, drain 16, and gate 18 surrounding a channel 22. A fin structure is one kind of device having a multi-gate structure 20, having a better subthreshold swing, better scaling ability, and lower parasitic leakage than non-fin structures. As shown, typically no body contact exists. However, for some input/output circuits and test patterns, there should be a body contact for parameter extraction and functional operation. In a device with a bulk contact, gate oxide thickness may be measured using the capacitance-to-voltage curve. Such a measurement cannot be done without a body contact.

SUMMARY

Accordingly, it is an object of one embodiment of the present disclosure to provide an effective and manufacturable process for fabricating a Finfet device having a body contact.

Another object of one embodiment of the present disclosure is to provide a method for fabricating a Finfet device having a T-shaped active region.

In accordance with the objects of various embodiments of the present disclosure, one embodiment of a method for fabricating a Finfet device with body contacts may be achieved. A silicon-on-insulator substrate is provided. A T-shaped active region is defined in the silicon layer of the silicon-on-insulator substrate wherein a source and a drain region form two ends of a cross bar of the T-shaped active region and wherein a body contact region forms a leg of the T-shaped active region. A gate oxide layer is grown on the active region. A polysilicon layer is deposited overlying the gate oxide layer and patterned to form a gate wherein an end of the gate partially overlies the body contact region to complete formation of a Finfet with body contact in the fabrication of an integrated circuit.

Also in accordance with at least some objects of this disclosure, one embodiment of a Finfet device is achieved. The Finfet device comprises a T-shaped active region wherein a source and a drain region form two ends of a cross bar of the T-shaped active region and wherein a body contact region forms a leg of the T-shaped active region and a polysilicon gate overlying a gate oxide layer wherein an end of the gate partially overlies the body contact region.

BRIEF DESCRIPTION OF THE DRAWINGS

In the following drawings forming a material part of this description, there is shown.

DETAILED DESCRIPTION

Figure 1:
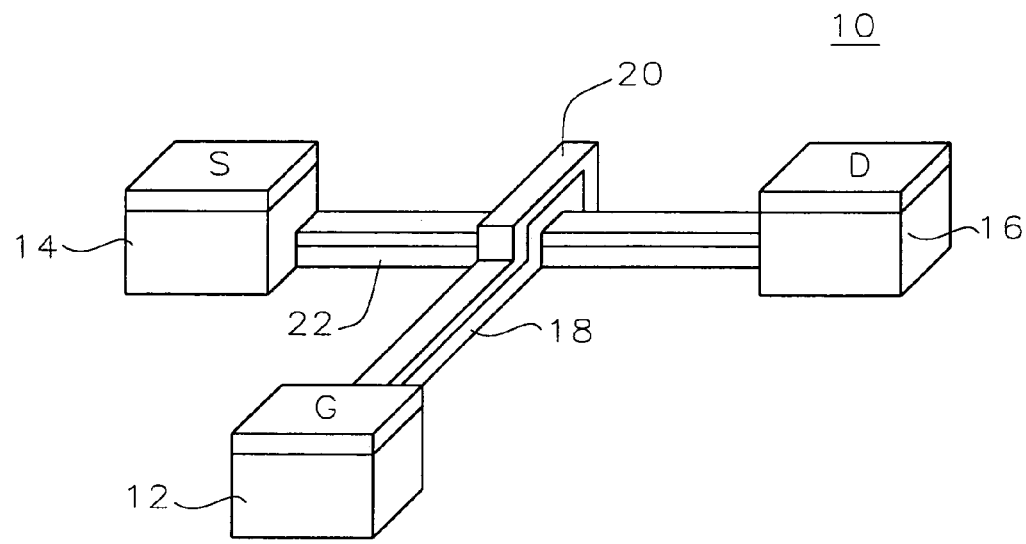
FIG. 1 is an isometric representation of a prior art Finfet device without body contacts.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 3:
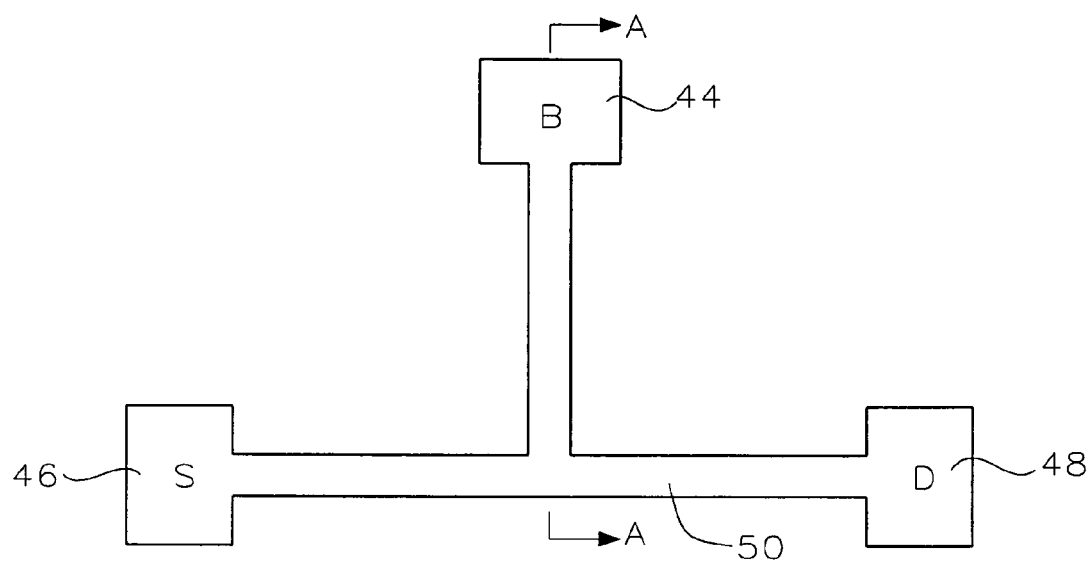
FIGS. 3, 5, 7, and 9 are top views of one embodiment of the present disclosure.
Figure 4:
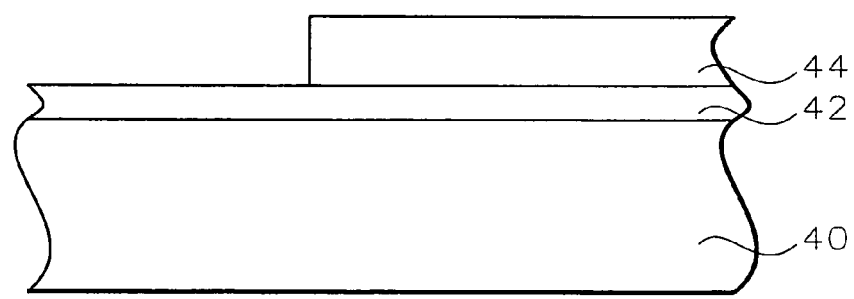
FIGS. 4, 6, 8, and 10 are schematic cross-sectional representations of view A—A of FIGS. 3, 5, 7, and 9, respectively.

In one embodiment, the process of the present disclosure provides a method for fabricating a Finfet device with a body contact. Referring now more particularly to FIGS. 3 and 4, there is shown a partially completed integrated circuit device. A silicon-on-insulator device is provided. The silicon-on-insulator device comprises a first semiconductor substrate 40 preferably composed of silicon having a (100) crystallographic orientation. An insulating layer 42 lies on top of the semiconductor substrate 40. A silicon layer 44 is formed overlying the insulating layer 42.

The silicon layer 44 is patterned to define a fin region 50, source 46, drain 48, and body contact 44, as shown in top view in FIG. 3. Typically, the silicon layer 44 has a thickness of between about 100 and 1000 Angstroms. The silicon layer 44 is etched all the way to the buried oxide layer to form the device regions as shown. FIG. 4 shows the cross-section A—A of FIG. 3. Body contact region 44 is shown in FIG. 4. An ion implantation may be performed to adjust the silicon doping. For example, boron or arsenic ions may be implanted with a dosage of between about 1E11 and 1E15 ions/cm$^2$ at an energy of between about 1 and 30 KeV. The source/drain regions will be doped with a higher dosage of more than about 1E15 ions/cm$^2$ to obtain a small sheet resistance.

Figure 5:
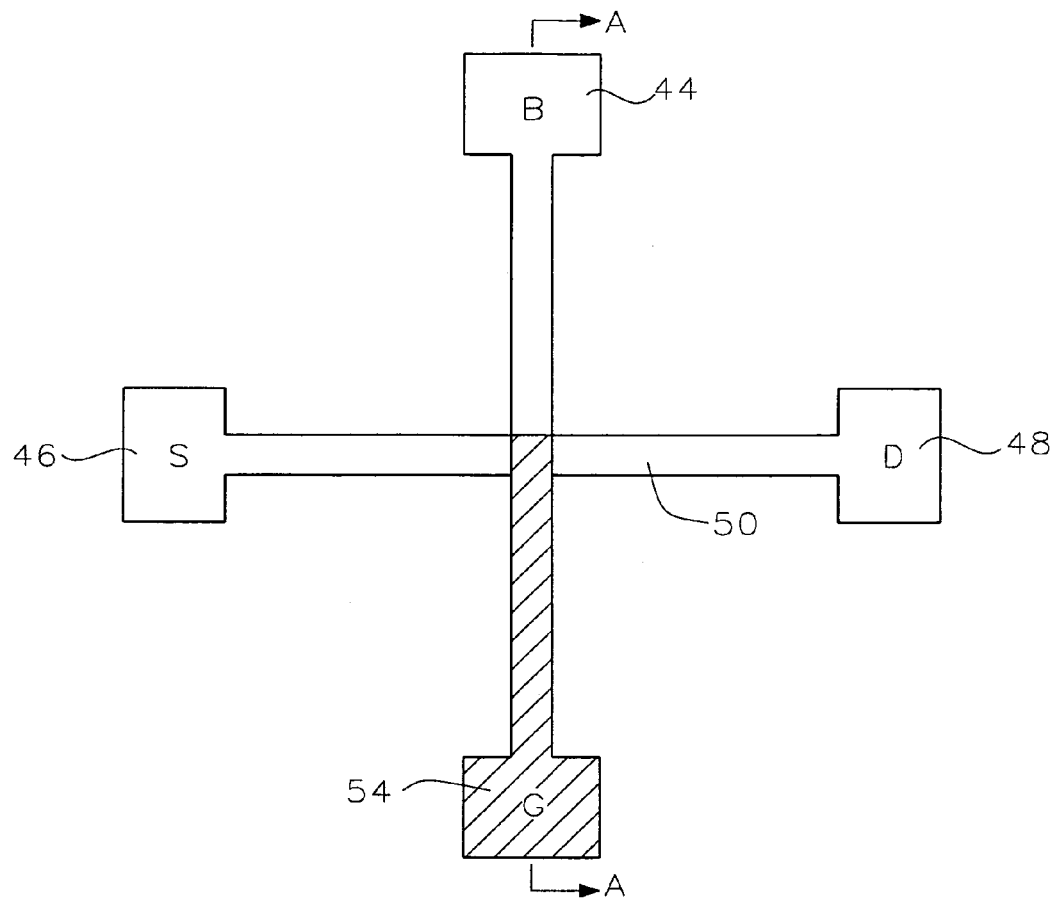
Figure 6:
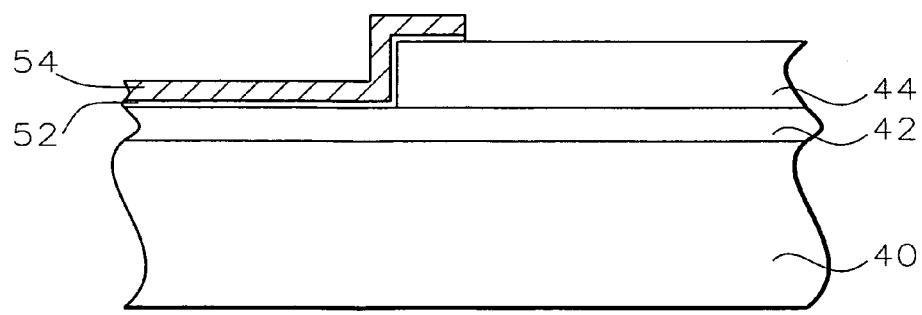

Referring to FIGS. 5 and 6, the gate electrode may be fabricated as follows. A gate dielectric layer 52 such as an oxide layer is grown over the silicon fin, including the source, drain, and channel regions 46, 48, and 50, and the body region 44 to a thickness of between about 5 to 100 Angstroms. The gate dielectric layer may also be nitrided oxide or any dielectric material having a high dielectric constant greater than about 5. A gate polysilicon layer 54 is deposited over the gate dielectric layer 52 and patterned to form the gate, as shown in top view in FIG. 5 and in cross-section in FIG. 6. The gate polysilicon layer 54 is deposited by low pressure chemical vapor deposition (LPCVD) to a thickness of between about 300 and 2000 Angstroms. Other gate materials could be used, such as, for example, polysilicon germanium or metals.

Figure 7:
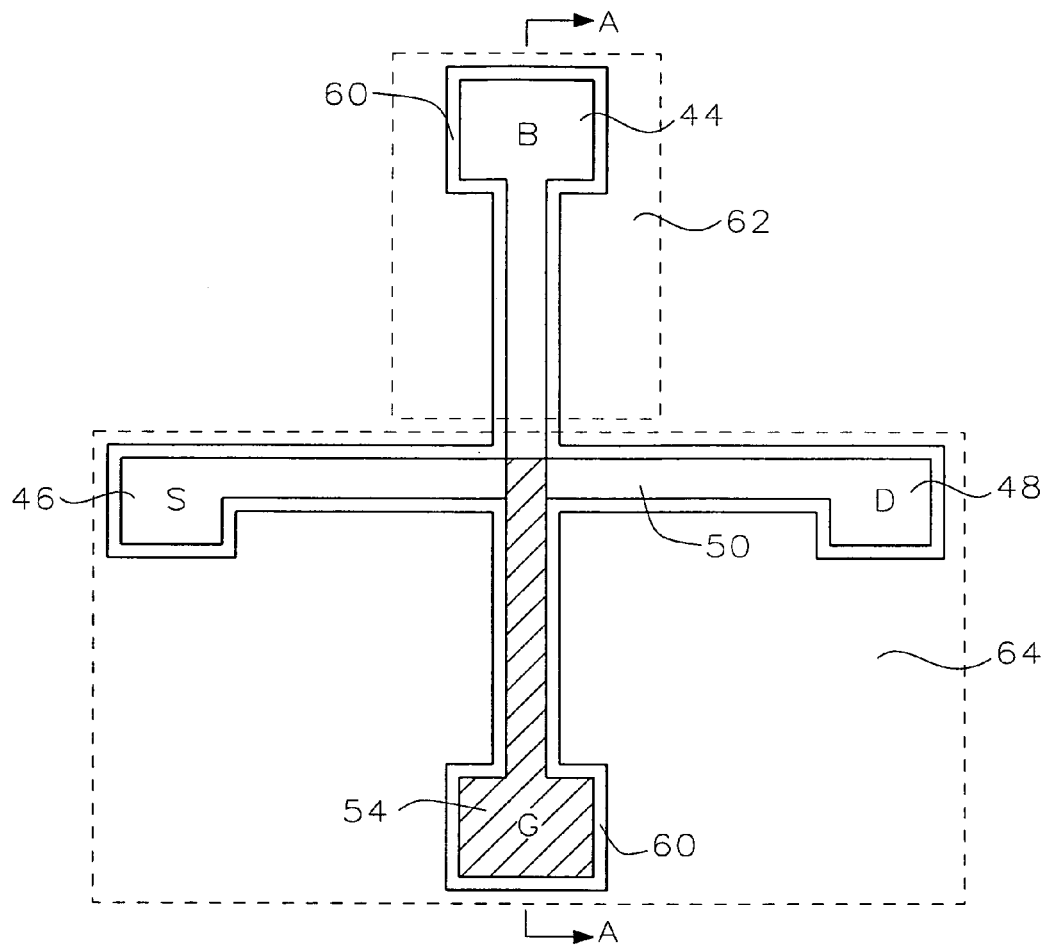
Figure 8:
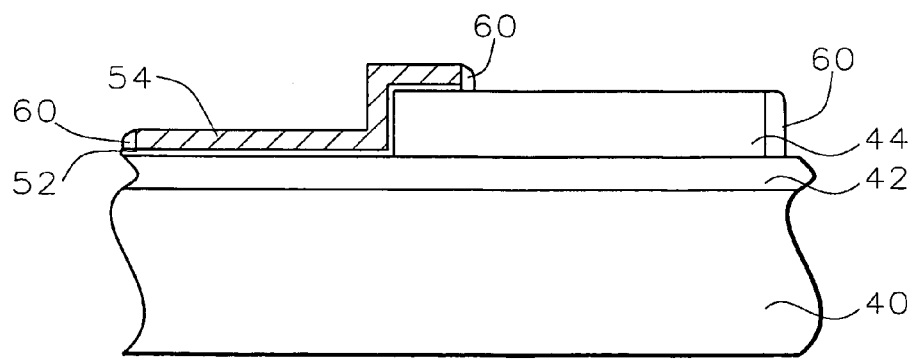

Referring to FIGS. 6 and 7, the gate 54 is in a plane perpendicular to the source/drain fin 46/48/50. The gate 54 partly overlaps the body contact region 44 at one end as shown in the figures. A dielectric layer is blanket deposited over the device structures and anisotropically etched back to leave spacers 60 on the sidewalls of the device structures, as shown in top view in FIG. 7 and in cross-section in FIG. 8. The dielectric layer preferably comprises silicon dioxide or other high dielectric constant dielectric material.

Now, the body contact region is implanted with a P+ implant 62. For example, boron ions are implanted with a dosage of between about 1E14 and 5E15 ions/cm at an energy of between about 1 and 50 KeV. The body contact region underlying the gate is the channel region. This has been implanted prior to gate formation with a threshold adjustment implantation, not shown. The source/drain and gate regions are implanted with an N+ implant 64. For example, phosphorus or arsenic ions are implanted with a dosage of between about 1E14 and 5E15 ions/cm$^2$ at an energy of between about 1 and 50 KeV. This will form an NMOS device. For a PMOS device, N+ ions may be implanted into the body contact region and P+ ions into the source and drain regions.

Figure 9:
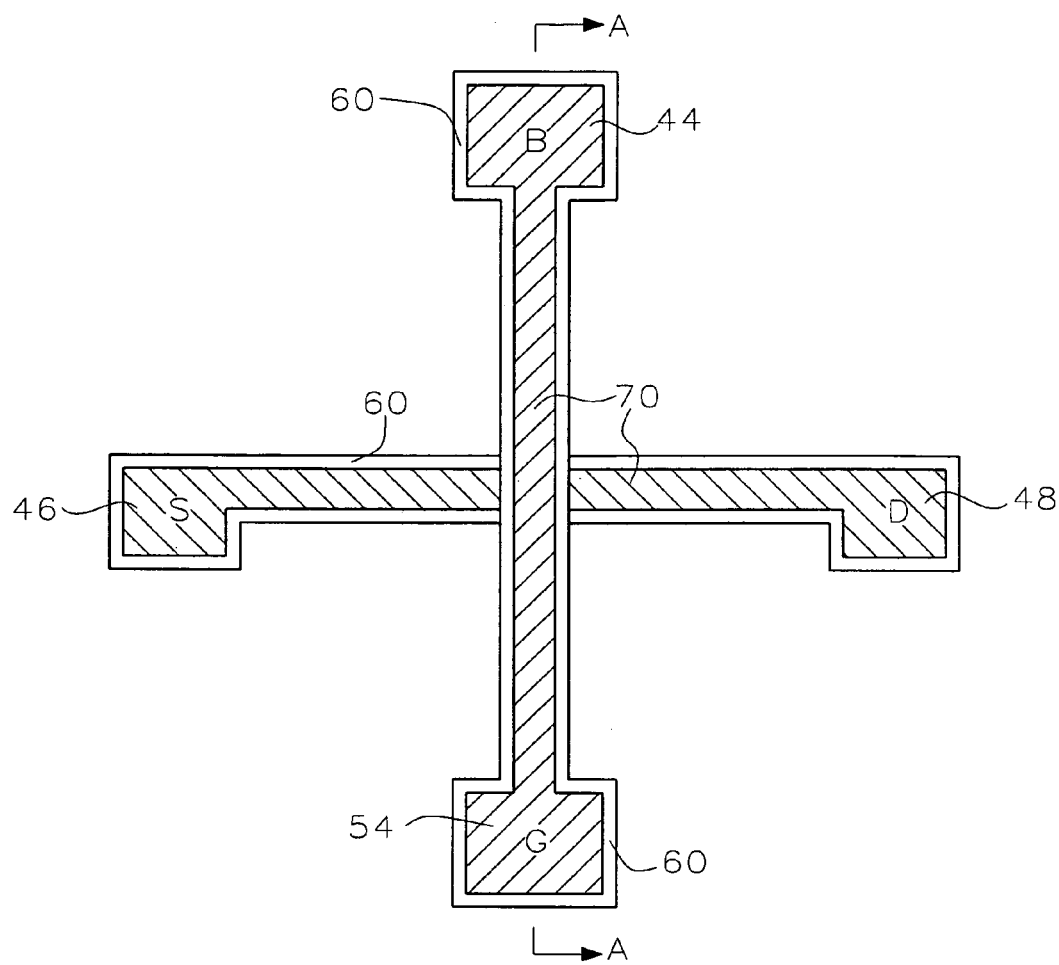
Figure 10:
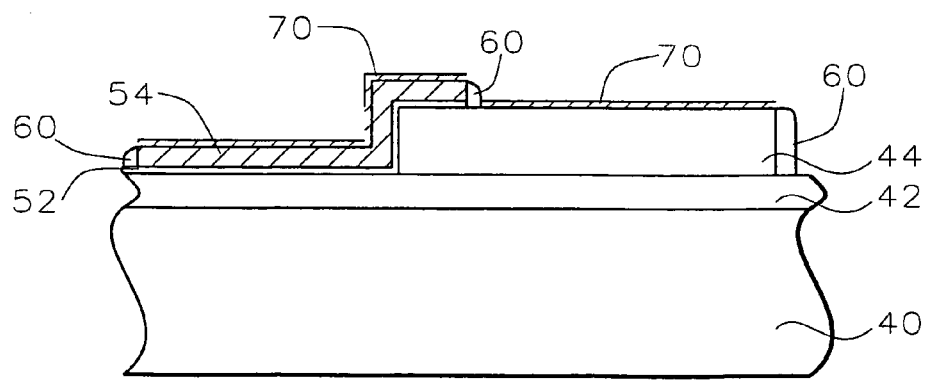

Referring to FIGS. 9 and 10, the source, drain, body region, and gate are to be silicided. Salication is performed as is conventional in the art. For example, a metal layer such as titanium, nickel, platinum, erbium, or cobalt is deposited over the structures and subjected to annealing. The metal reacts with the underlying silicon to form a metal silicide such as titanium silicide. The metal overlying dielectric layers such as the insulator layer 42 and the dielectric spacers 60 is unreacted and removed by an etching step. The silicided structures 70 are shown in top view in FIG. 9 and in cross-section in FIG. 10.

Figure 2:
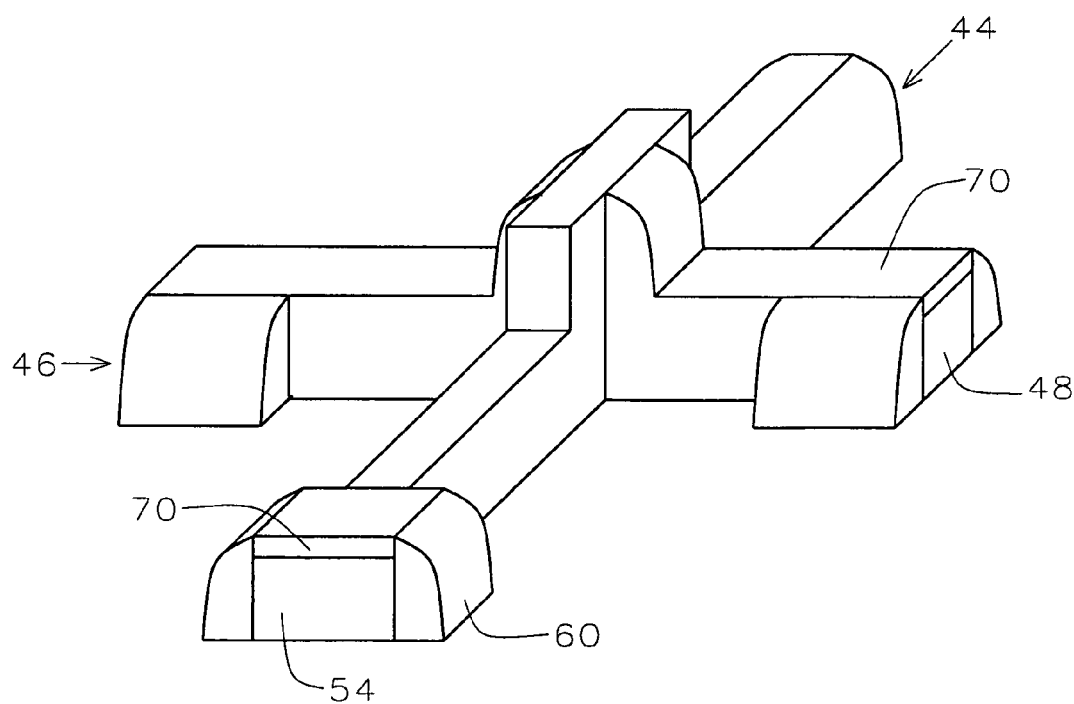
FIG. 2 is an isometric representation of a Finfet device with a body contact according to one embodiment of the present disclosure.

Accordingly, a Finfet with body contact is formed. The body contact provides a contact path to the channel region. FIG. 2 is an isometric view of the completed Finfet. This figure shows a T-shaped active region. The gate 54 contacts the body region 44. This technology can be used in input/output devices, electrostatic discharge (ESD) devices, and in test patterns for monitoring process parameters such as gate oxide integrity (GOI), for example.

Figure 11:
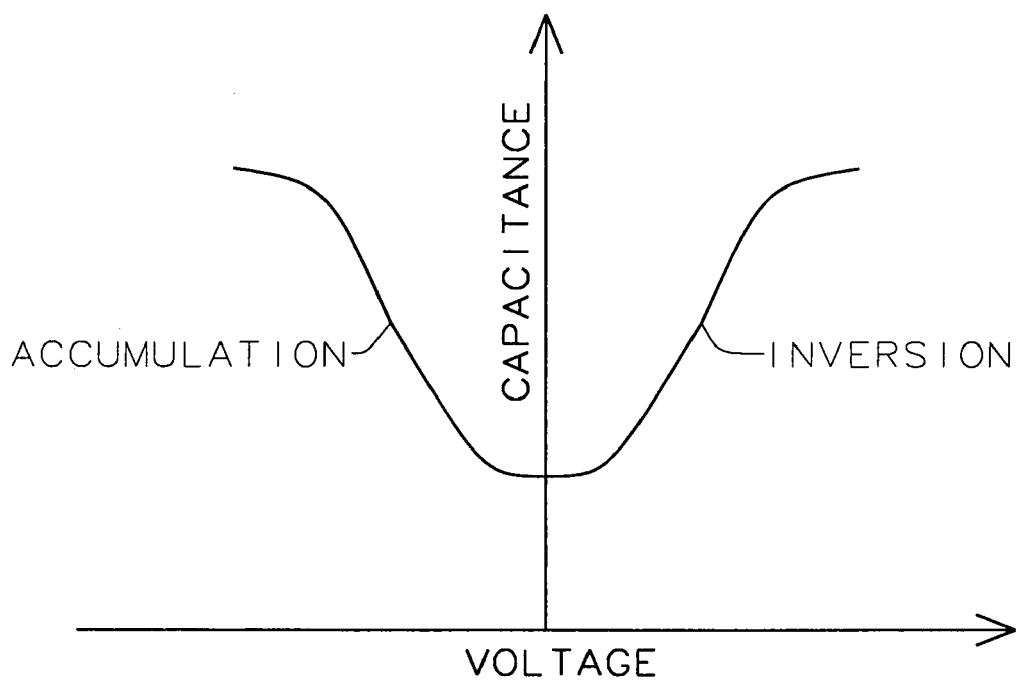
FIG. 11 illustrates a C-V curve for a Finfet device having a body contact.

For example, in a device with a body contact, the gate thickness may be measured using a capacitance to voltage (C-V) curve, as shown in FIG. 11. This C-V curve can be used for lateral gate oxide integrity monitoring if we have a body contact. Gate current can also be monitored if a body contact exists.

Figure 12:
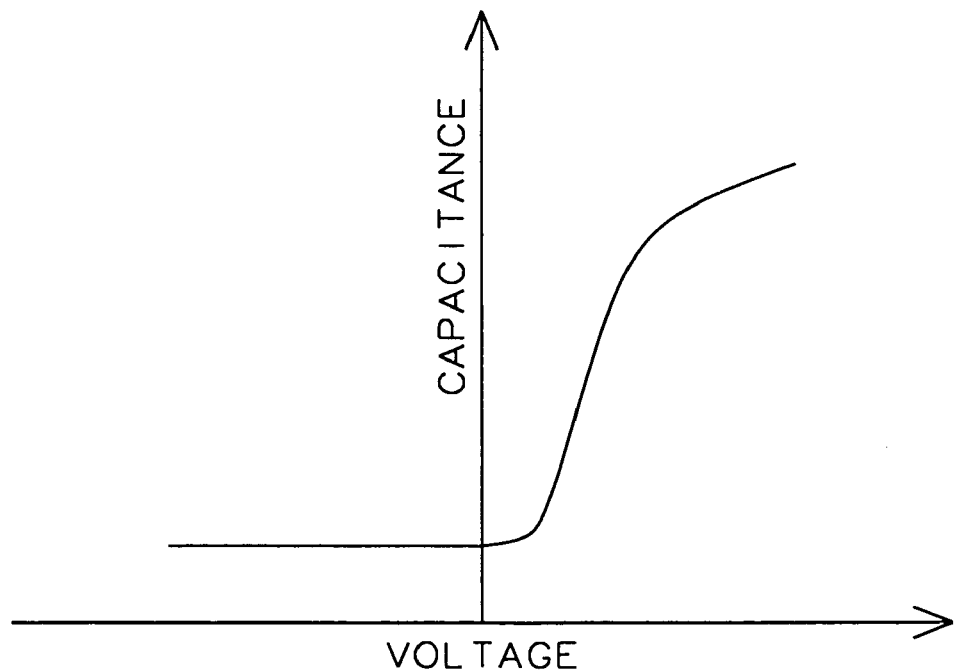
FIG. 12 illustrates a C-V curve for a Finfet device without a body contact.

In a device without a body contact, the C-V curve looks like the curve in FIG. 12. That is, only the gate oxide thickness inversion can be obtained. Parameters such as poly depletion effect and gate leakage cannot be extracted without a body contact.

The process of the present disclosure provides the capability of measuring C-V in GOI devices. Furthermore, some analog circuits need a body contact in order to function; for example, a phase lock loop circuit. The process of the present disclosure is useful in this application as well.

Accordingly, the process of the present invention provides an effective and very manufacturable process for fabricating a Finfet device with body contacts.

While the invention has been particularly shown and described with reference to the preferred embodiments thereof, it will be understood by those skilled in the art that various changes in form and details may be made without departing from the spirit and scope of the invention.

What is claimed is:

1. A method of forming a Finfet device with a contact path to a channel region in the fabrication of an integrated circuit device using a silicon-on-insulator substrate, the method comprising:

defining a T-shaped active region in the silicon layer of said silicon-on-insulator substrate, wherein a source and a drain region form two ends of a cross bar of said T-shaped active region and wherein a channel region forms a central portion of said cross bar and wherein a body contact region forms a leg of said T-shaped active region;

growing a gate dielectric layer on said active region; and depositing a gate material layer overlying said gate dielectric layer and patterning said gate material layer to form a gate, wherein said gate lies perpendicular to said cross-bar and wherein an end of said gate partially overlies said body contact region providing said contact path to said channel region to complete formation of said Finfet device with said contact path to said channel region in said fabrication of said integrated circuit device.

2. The method according to claim 1 wherein said gate dielectric layer comprises gate oxide, nitrided oxide, or a dielectric material having a high dielectric constant greater than 5.

3. The method according to claim 1 wherein said gate material comprises polysilicon, polysilicon germanium, or metals.

4. The method according to claim 1 further comprising forming dielectric spacers on sidewalls of said source, said drain, said body contact region, and said gate.

5. The method according to claim 1 further comprising forming a NMOS device by implanting P+ ions into said body contact region and implanting N+ ions into said source, said drain, and said gate.

6. The method according to claim 1 further comprising forming a PMOS device by implanting N+ ions into said body contact region and implanting P+ ions into said source, said drain, and said gate.

7. The method according to claim 1 further comprising saliciding said source, said drain, said body contact region, and said gate.

8. A method of forming a Finfet device with a body contact in the fabrication of an integrated circuit device using a silicon-on-insulator substrate, the method comprising:

defining a T-shaped active region in the silicon layer of said silicon-on-insulator substrate, wherein a source and a drain region form two ends of a cross bar of said T-shaped active region and wherein a channel region forms a central portion of said cross bar and wherein a body contact region forms a leg of said T-shaped active region;

growing a gate oxide layer on said active region;

depositing a polysilicon layer overlying said gate oxide layer and patterning said polysilicon layer to form a gate, wherein said gate lies perpendicular to said cross-bar and wherein an end of said gate partially overlies said body contact region providing a contact path to said channel region to complete formation of said Finfet device with said contact path to said channel region in said fabrication of said integrated circuit device;

forming dielectric spacers on sidewalls of said source, said drain, said body contact region, and said gate;

thereafter implanting ions of a first conductivity type into said body contact region; and implanting ions of a second conductivity type opposite to said first conductivity type into said source, said drain, and said gate to complete formation of said Finfet device with said body contact in said fabrication of said integrated circuit device.

9. The method according to claim 8 wherein said step of implanting ions of said first conductivity type comprises implanting boron or BF2 ions at a dosage of between about 1E14 and 5E15 ions/cm$^2$ at an energy of between about 1 and 50 KeV.

10. The method according to claim 8 wherein said step of implanting ions of said second conductivity type comprises implanting arsenic or phosphorus ions at a dosage of between about 1E14 and 5E15 ions/cm$^2$ at an energy of between about 1 and 50 KeV.

11. The method according to claim 8 further comprising saliciding said source, said drain, said body contact region, and said gate.

* * * * *